(12) United States Patent
Heuer et al.

(10) Patent No.: US 10,298,218 B2
(45) Date of Patent: May 21, 2019

(54) METHOD AND DEVICE FOR CONTROLLING AN ELECTRICAL OR ELECTRONIC SWITCHING ELEMENT

(71) Applicant: Phoenix Contact GmbH & Co. KG, Blomberg (DE)

(72) Inventors: Lutz Heuer, Blomberg (DE); Stephan Hansmeier, Bad Salzuflen (DE); Bernd Schulz, Hoexter (DE); Dirk Plewka, Nieheim (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 139 days.

(21) Appl. No.: 15/361,384

(22) Filed: Nov. 26, 2016

(65) Prior Publication Data

US 2017/0155250 A1  Jun. 1, 2017

(30) Foreign Application Priority Data

Nov. 27, 2015 (DE) .................. 10 2015 120 658

(51) Int. Cl.
| | | |
|---|---|---|
| *H02J 4/00* | (2006.01) | |
| *H03K 7/08* | (2006.01) | |
| *H03K 17/14* | (2006.01) | |
| *H03K 17/18* | (2006.01) | |

(52) U.S. Cl.
CPC .................. *H03K 7/08* (2013.01); *H02J 4/00* (2013.01); *H03K 17/14* (2013.01); *H03K 17/18* (2013.01)

(58) Field of Classification Search
CPC ........ H03K 7/08; H03K 17/14; H03K 17/145; H03K 17/18
See application file for complete search history.

(56) References Cited

U.S. PATENT DOCUMENTS

| | | | |
|---|---|---|---|
| 7,327,203 B2 | 2/2008 | Asada | |
| 2007/0279954 A1* | 12/2007 | Garrett | H02M 3/33561 363/91 |
| 2011/0298527 A1* | 12/2011 | Lloyd | H03K 7/08 327/478 |
| 2012/0081173 A1 | 4/2012 | Hsieh | |
| 2014/0043076 A1 | 2/2014 | Hesener | |
| 2015/0002126 A1* | 1/2015 | Ouyang | H02M 3/1584 323/304 |

(Continued)

FOREIGN PATENT DOCUMENTS

| | | |
|---|---|---|
| DE | 195 22 045 A1 | 1/1996 |
| DE | 10048593 A1 | 4/2002 |

(Continued)

OTHER PUBLICATIONS

European Search Report dated Apr. 11, 2017, issued in connection with European Patent Application No. 16200834.6 (8 pages total).

*Primary Examiner* — Ryan Johnson
(74) *Attorney, Agent, or Firm* — John Maldjian; Maldjian Law Group LLC (57) ABSTRACT

The invention relates to a method and a device for controlling an electrical or electronic switching element that can be activated by an electrical signal, wherein a PWM signal can be produced by a PWM module for controlling the switching element and which can be modulated as a function of the supply voltage and/or of an ambient temperature on the electromechanical or electronic switch.

12 Claims, 4 Drawing Sheets

(56) References Cited

U.S. PATENT DOCUMENTS

| | | | |
|---|---|---|---|
| 2015/0188530 A1* | 7/2015 | Shinohara | H03K 3/011 327/172 |
| 2015/0311798 A1* | 10/2015 | Yuan | H02M 3/156 323/288 |
| 2016/0191053 A1* | 6/2016 | Esmaeili | H03K 17/61 327/109 |

FOREIGN PATENT DOCUMENTS

| | | |
|---|---|---|
| DE | 102005053738 A1 | 5/2006 |
| DE | 10 2011 050 719 A1 | 12/2012 |
| EP | 2 178 211 A1 | 4/2010 |
| WO | 2005/039029 A2 | 4/2005 |
| WO | 2015/051248 A1 | 4/2015 |

\* cited by examiner

METHOD AND DEVICE FOR CONTROLLING AN ELECTRICAL OR ELECTRONIC SWITCHING ELEMENT

FIELD

The invention relates to a method and a device for controlling an electrical or electronic switching element that can be activated by an electrical signal, in particular for switching an electrical load, preferably of an electromotor.

BACKGROUND

Electrical or electronic switching elements for switching an electrical load which can be activated by electrical signals, that is, which can be switched or actuated, are known from the prior art. In them, the switching state is not changed by a manual activation but rather by an electrical control- or switching signal. They are accordingly to be delimited from manually activated switches.

Electrical switching elements can be constructed, for example, as electromechanical or electromagnetic switches such as relays, contactors, etc.

Electrical switching elements can be constructed, for example as electronic switches or semiconductor switches such as transistors, thyristors or triacs, MOSFET (Metal Oxide Semiconductor Field Effect Transistor), IGBT transistors (Insulated Gate Bipolar Transistor) or IGCT Thyristors (Integrated Gate Commutated Thyristor), etc.

The electrical switching signal for activating electrical or electronic switching elements can be constructed to be either constant or also variable in time, as a function of the usage.

It is known from the prior art to control electrical and electronic switching elements by electrical signals which are based on a pulse-width modulation (PWM), that is, are pulse-width-modulated. Consequently, electrical and electronic switching elements can be controlled by so-called PWM signals.

Furthermore, phase controls for controlling electromotors are known which can represent a type of pulse-width modulation.

A switching arrangement is known from DE 195 22 045 A1 for the power part of a pulse-width modulator for controlling an electrical motor, wherein a transistor is controlled in a pulse-width-modulated manner. Here, an excessive heating of a capacitor which is charged and discharged by the electromotor is prevented, in particular in the case of small pulse widths and low speeds, and the efficiency of the electromotor is significantly improved.

A motor drive circuit for three-phase motors is known from DE 10 2011 050 719 A1 which receives current from transfer devices. These devices consist of a rectifier which produces a direct voltage for a direct voltage intermediate circuit from an alternating current mains voltage, wherein this intermediate circuit feeds an inverter. Inverters operate on the basis of power-electronic switches which are designed, for example, as MOSFET, IGBT transistors or IGCT thyristors. The latter generate a variable voltage by pulse-width modulation, wherein the level of the output voltage and the frequency can be regulated within broad limits in order to drive asynchronous motors as well as synchronous motors.

In order to generate PWM signals, integrated circuits, microcontrollers or also discrete circuits are customarily used which are constructed as a PWM module or can comprise or include such a PWM module. PWM modules for generating the PWM signals are customarily also designated as PWM generators.

In order to be able to control electrical or electronic switching elements by PWM signals, in particular in a reliable manner, it is known to take the technical characteristics of the switching elements as basis when dimensioning these PWM signals. That means that the PWM signals are dimensioned or must be dimensioned in a corresponding manner so that an activation of an electrical or electronic switching element to be controlled in an appropriate manner can be ensured even for the case or cases of very unfavorable parameters of operation or of use.

For example, switching thresholds at which a sufficient voltage and/or a sufficient current for activating an electrical or electronic switching element is/are present, in particular from semiconductor switches such as thyristors or triacs but also from electromagnetic switching elements such as relays or contactors are dependent on the environmental temperature.

Therefore, it is necessary, for example, for a reliable ignition of a thyristor or of a triac, especially in order to ensure a reliable ignition of a thyristor even in the case of a sharply rising main current, that an electrical control impulse is present with a sufficient current amplitude, for example, with a fivefold gate current and a current slope greater than one ampere per microsecond. The necessary ignition impulse is dependent here on the chip temperature of the thyristor.

As a consequence, the required ignition current for, e.g., thyristors and triacs is heavily dependent of the temperature of the semiconductor. At low temperatures a higher ignition current is needed. However, a higher ignition current leads at high temperatures to unnecessary losses.

In addition, even the voltage supply of the electrical or electronic switching elements can be basically variable or not always constant, for example when using non-regulated mains parts for the voltage supply.

Therefore, preferably integrated circuits or microcontrollers are used for generating the electrical signals for controlling the electrical or electronic switching elements. However, since microcontrollers in general cannot make the necessary energy available for activating the switching elements, in particular not the necessary ignition energy for the control impulses of thyristors, additional end amplifier stages must often be used for strengthening the electrical signals.

End amplifier stages can basically be supplied with variable supply voltages. To this end economical, unregulated mains parts can be used which, however, have a variable output voltage, for example, for supplying devices with 24 volts and in an operating range of 18 to 30 volts.

In order to take into account the above-described problems of fluctuating environmental temperatures and or supply voltages, it is therefore customary to dimension PWM signals for electrical and electronic switching elements in a corresponding manner so that an activation of an electrical or electronic switching element to be controlled in a corresponding manner can also be ensured for the case or cases of very unfavorable operating parameters, for example, in the case of the lowest acceptable supply voltage and/or environmental temperature.

However, this procedure in the dimensioning of PWM signals has the disadvantage that given the presence of other operating parameters, for example, given a very high ambient temperature and/or supply voltage, very high losses are the consequence, in particular associated with low efficiencies and/or damage to the electrical or electronic switching elements or with other consequential damage.

Therefore, the smallest admissible supply voltage and the lowest ambient temperature, for example, 18 volts and −25° C. are preferably used and taken for the dimensioning of electrical and electronic switching elements and correspondingly high losses in operating parameters of, for example, 30 volts and +70° C. Celsius are accepted.

Given this background, the invention has the particular problem of making a possibility available for controlling electrical or electronic switching elements which can be activated by an electrical signal in a simple, reliable and/or secure manner and to also further reduce, if possible, electrical losses more and to raise the energy efficiency and the economy of these switching elements.

The above-cited problems are solved by the features of the independent claims. Preferred further developments are subject matter of the dependent claims.

SUMMARY

According to the invention a device and a corresponding method for controlling an electrical or electronic switching element which can be activated by an electrical signal are designed or constructed in such a manner that that a supply voltage can be put or is put on a PWM module.

Moreover, a supply voltage can be measured or is measured with a voltage measuring device and/or an ambient temperature on the switching element can be measured or is measured with a temperature measuring device.

A PWM signal for controlling the electrical or electronic switching element is generated by the PWM module, wherein the PWM signal can be or is advantageously controlled as a function of the supply voltage and/or advantageously as a function of the ambient temperature and/or as a function of a switching state on the electrical or electronic switching element.

A PWM signal in the sense of the invention is understood to be an electrical signal which alternates during a time period between at least two values of the voltage and/or of the current. A PWM signal is preferably a rectangular signal, wherein other signals are also within the scope of the invention.

Furthermore, the frequency can vary in an electrical signal in the sense of the invention constructed as a PWM signal. The frequency can act continuously also be a function of other parameters or measuring magnitudes such as, for example, of the supply voltage measured by the voltage measuring device and/or the ambient temperature measured by the temperature measuring device. However, the frequency of a PWM signal is preferably constant.

The controlling of the PWM signal in the sense of the invention takes place as a function of the supply voltage and/or as a function of the ambient temperature on the electrical or electronic switching element. A control in the sense of the invention is to be understood as the forming of the degree of control, also designated as the pulse-duty factor.

This degree of control indicates the ratio of the impulse time or pulse width of a PWM signal in a relationship with a period time of this PWM signal for a sequence of PWM signals and is customarily indicated in percentage. Therefore, the mean value of an electrical voltage or of a current can be changed by the variation of the degree of control. Therefore, a variable control of a switching element is possible even without a loss of performance by the varying of the degree of control.

Furthermore, it is pointed out that the concept "ambient temperature" in the sense of the patent application denotes every temperature in the environment of the electrical or electronic switching element to be appropriately activated, wherein the temperature in this connection can also be detected directly on a surface of the switching element or also inside the switching element, for example, on a semiconductor or on a chip. In this manner the temperature measuring device can advantageously also be detected or measured by the switching element itself and the corresponding temperature signal can be taken off on an electrical connection of the switching element to be activated.

In sum, therefore, the invention in particular suggests forming a PWM signal in a variable manner and therefore dependent on a supply voltage and/or on ambient temperature.

Other advantages of the invention are, among other things, the fact that energy and with it also a loss of power are saved, wherein the electrical or electronic switching element can be reliably switched even under extreme conditions of the ambient temperature and/or of the supply voltage. Therefore, it is in particular possible to reliably switch a semiconductor and to save, for example, ignition energy for a thyristor or triac on an upstream mains part.

Therefore, a better usage of an ignition device, in particular for thyristors and triacs as well as an improvement of the efficiency are possible. In addition, even non-regulated mains parts can be used for the current supply of PWM modules and/or of the control unit and the uniform signal quality and constancy are ensured.

BRIEF DESCRIPTION OF THE DRAWINGS

Other advantages and features of the invention are apparent from the following, exemplary description of preferred embodiments with reference made to the attached drawings.

DETAILED DESCRIPTION

It is pointed out that in the figures components which are identical or have the same effect are designated by the same reference numerals.

Figure 1:
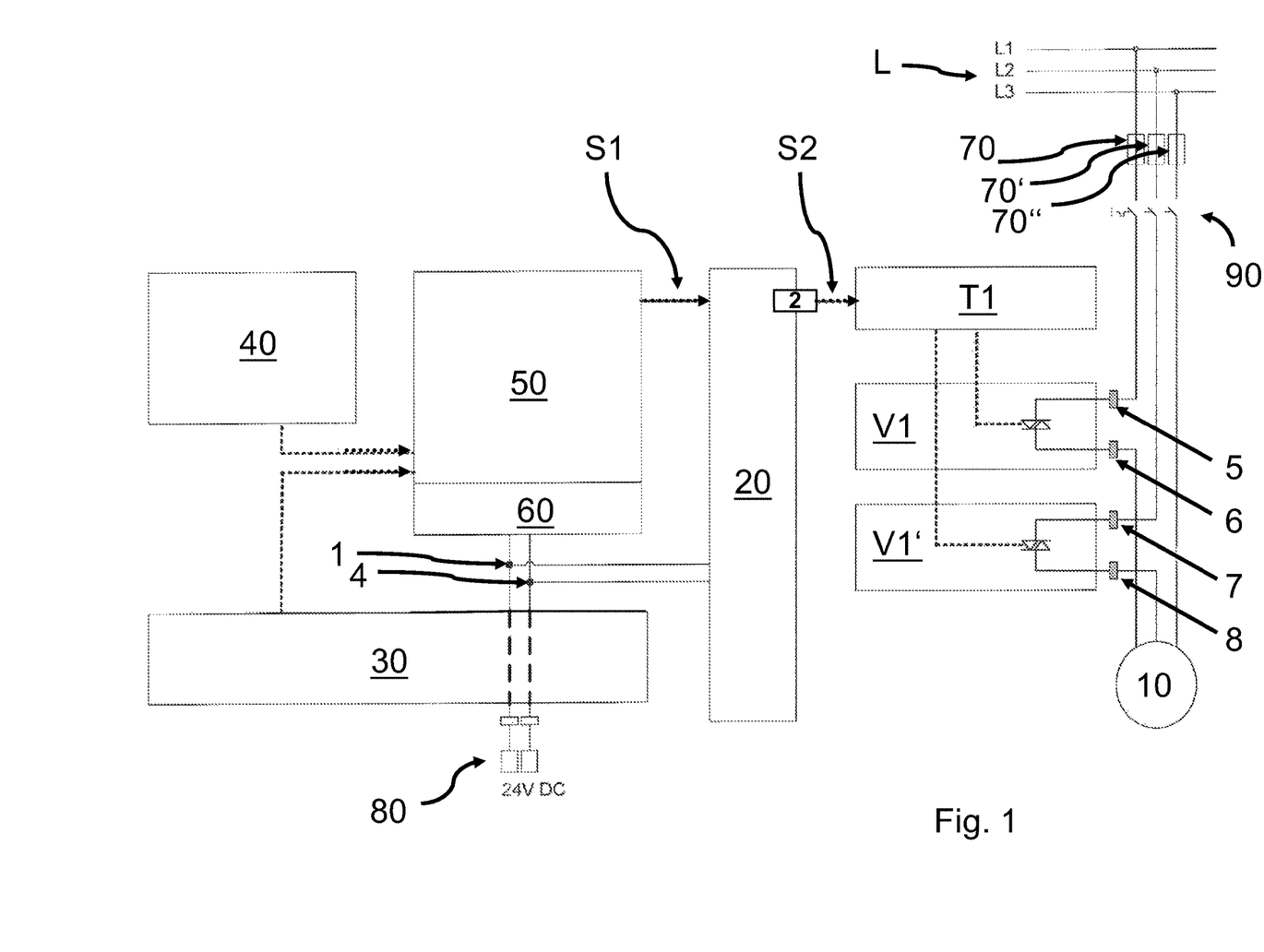
FIG. 1 shows a simplified block diagram of a switching arrangement of an embodiment of a device for controlling two electronic switching elements constructed as triacs with a PWM module.

FIG. 1 shows an exemplary embodiment of a device in which the invention is realized and which can be used to control electrical and electronic switching elements V1 and V1' which can be activated, that is, switched or activated by an electrical signal S2.

The device according to FIG. 1 therefore also illustrates a carrying out of a method in accordance with the invention for controlling electrical or electronic switching elements which can be activated by electrical signals.

The exemplary device according to FIG. 1 is suitable for controlling the switching elements V1 and V1', that is, therefore, for cutting in and out an electrical load 10, wherein this electrical load is constructed in this case as an electromotor. Consequently, the device according to FIG. 1 realizes, e.g., a motor switch or a motor control.

Moreover, of course even other and/or further electrical or stimulation switching elements can also be controlled with the device according to FIG. 1.

According to the present example the electrical switching elements V1 and V1' are advantageously designed as triacs. However, even other electrical or electronic switching elements can be used as an alternative. For example, electromechanical or electromagnetic switches, in particular such as, e.g., relays and/or electronic switches or semiconductor switches, in particular such as, for example, transistors, thyristors or triacs can be used as switching elements for motor switches of electromotors.

The electromotor 10 is advantageously constructed as a three-phase motor and is therefore connected to a supply mains L with a first, second and third conductor L1, L2 and L3 of the supply mains, wherein the first conductor L1 is connected to the electromotor 10 in a practical embodiment, e.g., by the first and the second switching contact 5 and 6 of the first triac V1, and the second conductor L2 is connected by the first and the second switching contacts 7 and 8 of the second triac V1' to the electromotor 10.

The third conductor L3 is directly connected in this case, e.g., to the electromotor 10, wherein even this third conductor L3 could be connected to the electromotor by another electrical switching element.

Furthermore, three safety switches 70, 70', 70", which could be constructed, for example, as electrical overload fuses, as well as a motor protection switch 90 are advantageously connected between the supply mains L and the electromotor 10.

In order to control the electrical switching elements V1 and V1' constructed as triacs, the device according to FIG. 1 comprises a PWM module 20 for generating the PWM signal S2, which is advantageously on a first output contact 2 of the PWM module 20, and is furthermore advantageously supplied in parallel by an ignition transformer T1 for the transformation of the PWM signal 20 to the two switching elements V1 and V1'.

The PWM signal S2 is modulated by the PWM module 20 in a certain ratio and, according to the example in FIG. 1, advantageously as a function of the supply voltage UB as well as of the ambient temperature TU, wherein it is also in the scope of the invention to modulate the PWM signal S2 either only as a function of the supply voltage UB or only as a function of the ambient temperature TU.

Consequently, a measuring device 40 which detects the ambient temperature is advantageously connected to a control unit 50, which is formed in FIG. 1 by a dotted connecting line with an arrow.

Furthermore, a voltage measuring device 30 is also advantageously connected to the control unit 50 which measuring device detects the supply voltage UB of the supply source 80, which is also indicated in FIG. 1 by dotted connecting lines with an arrow. This supply source 80 is advantageously constructed as an unregulated mains part.

The temperature measuring device 40 and the voltage measuring device 30 can be advantageously constructed as a voltage-divider switching arrangement.

The control 50, which advantageously comprises a microcontroller, is optionally separately arranged from the PWM module 20. Alternatively, the control 50 can, however, e.g., also be comprised by the PWM module.

Furthermore, the control 50 advantageously also comprises a regulated mains part 60. The mains part 60 and the PWM module 20 are advantageously supplied by the sole supply source 80, that is, in particular the unregulated mains part, for example with a 24 volt direct voltage, wherein to this end the PWM module 20 as well as the control unit 50 are connected to the first and the second contact of the supply source 80.

Accordingly, an electrical control signal S1 is formed in an optional intermediate step in the control unit 50 from the ambient temperature TU and the supply voltage UB, which signal is advantageously directly supplied according to the dotted arrow in FIG. 1 to the PWM module 20 for modulating the PWM signal S2.

As a consequence, the PWM signal S2 is modulated as a function of the supply voltage UB and as a function of the ambient temperature TU by the PWM module 20 and controls the switching elements V1 and V1' in this manner. In alternative embodiments of the invention, which is, however not shown in the figures for reasons of clarity, either the PWM module 20 comprises the control unit 50 or the control unit 50 comprises the PWM module 20.

Furthermore, the PWM module 20 can also advantageously comprise an additional end amplifier stage for amplifying the PWM signal S2, which is, however, also not shown in the figures for reasons of clarity.

The FIGS. 2a to 3c show different PWM signals 20 by way of example for controlling electrical or electronic switching elements V1 and V1' as a function of the ambient temperature TU and of the supply voltage UB, which are measured, e.g., on the temperature measuring device 40 and a voltage measuring device 30 according to FIG. 1.

Figure 4:
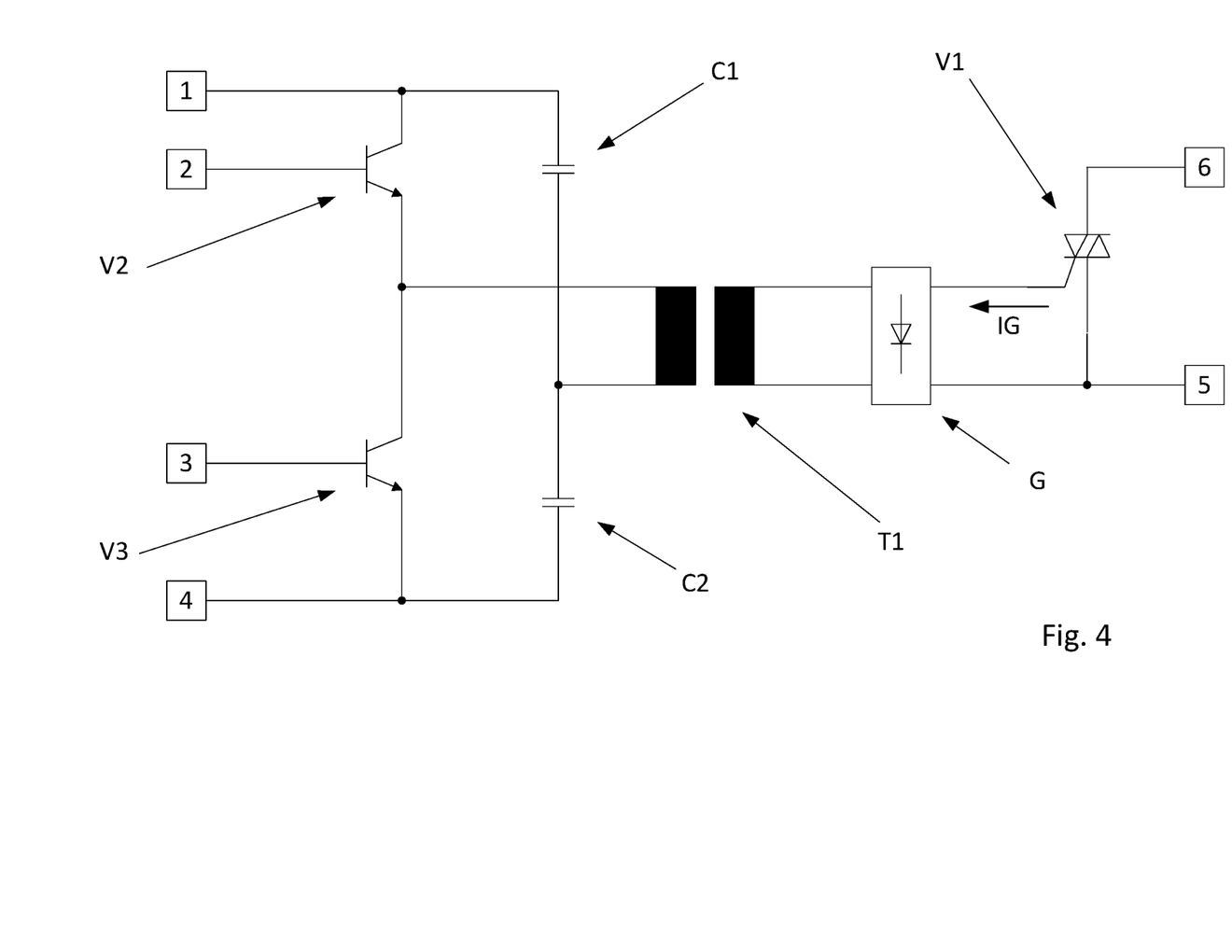
FIG. 4 shows another embodiment of a switching arrangement for controlling one or more switching elements, in particular triacs, in particular according to FIG. 1.

Therefore, these PWM signals 20 can be formed, for example, in a PWM module according to FIG. 1 and be used in the device according to FIG. 1 or 4 or also in an alternative switching arrangement.

The PWM signals 20 are advantageously formed as rectangular signals, wherein even other signal sorts or types are within the scope of the invention.

Figure 2A:
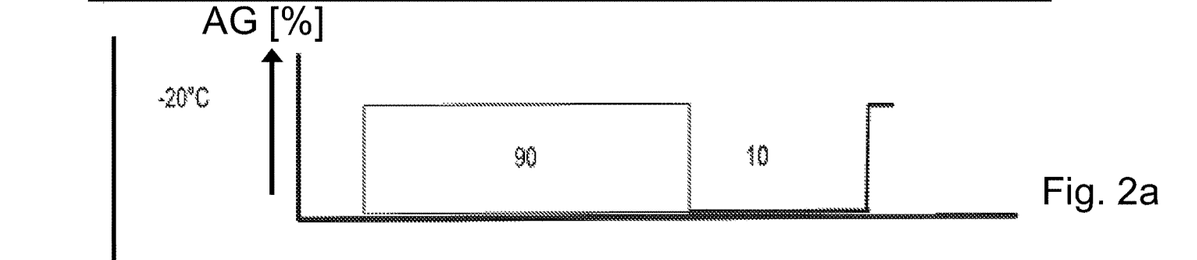
FIGS. 2a, 2b and 2c show exemplary degrees of control of PWM signals as a function of different ambient temperatures at the supply voltage of 18 volts.
Figure 2B:
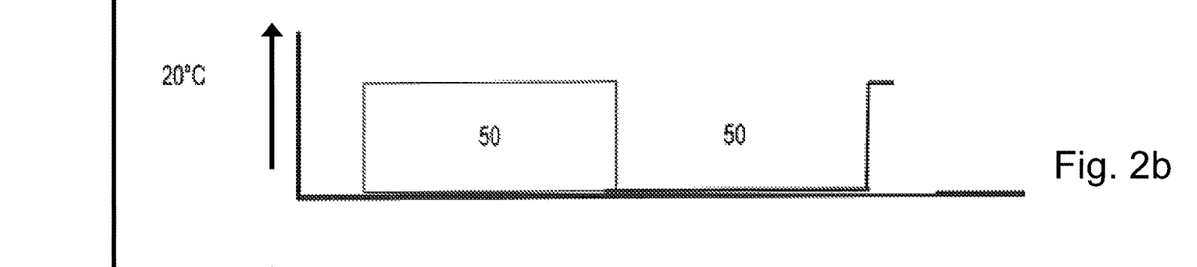
Figure 2C:
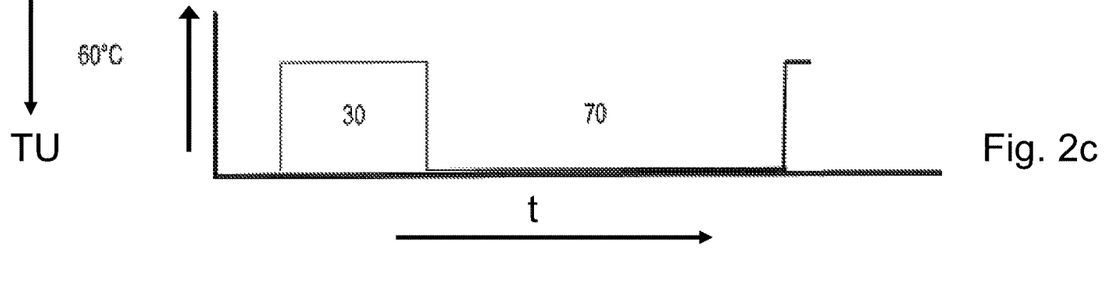

FIGS. 2a to 2c show by way of example corresponding modulating degrees AG at constant supply voltage of 18 volts and different ambient temperature TU measured by the temperature measuring device 40, that is, different ratios of impulse widths to a particular period time of a PWM signal. The frequency of the PWM signal 20 is constant here.

Therefore, for example, according to FIG. 2a the degree of modulation AG of the PWM signal 20 is 90 percent at an ambient temperature TU of −20° Celsius. That is, an element switching element V1 is cut in 90 percent of the period time and cut out 10 percent of the period time.

At an increase to 20° Celsius the degree of modulation AG is reduced, for example, to 50 percent according to FIG. 2b.

If the ambient temperature is raised further to 60° Celsius, then according to FIG. 2c the degree of modulation AG is only 30 percent.

Figure 3A:
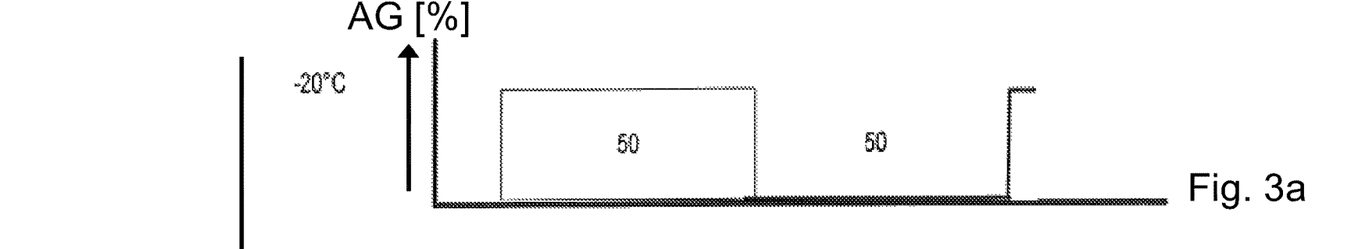
FIGS. 3a, 3b and 3c show exemplary degrees of PWM signals as a function of different ambient temperatures at a supply voltage of 30 volts.
Figure 3B:
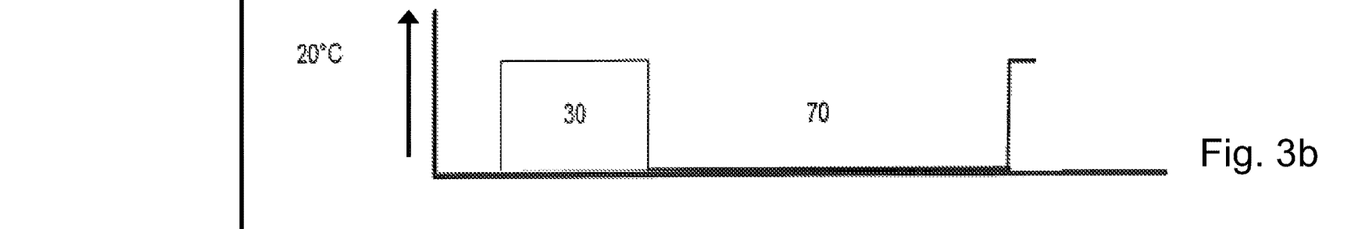
Figure 3C:
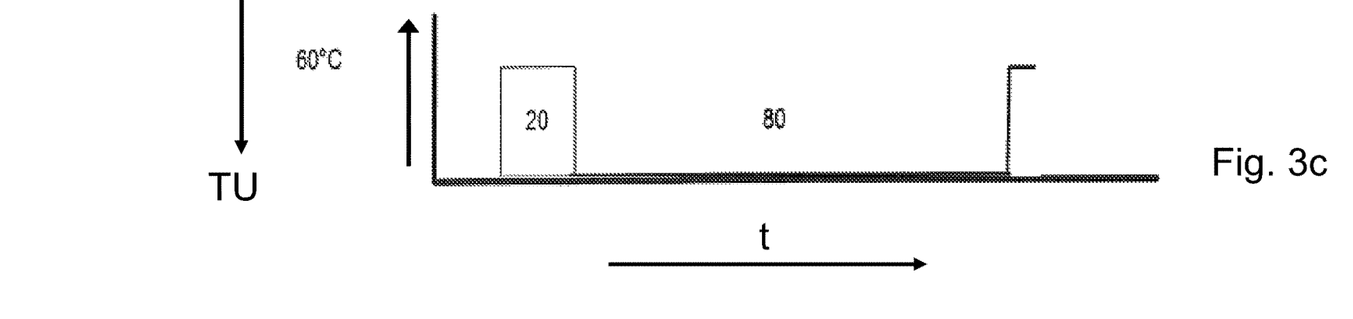

Furthermore, the FIGS. 3a to 3c show in distinction to the FIGS. 2a to 2c PWM signals 20 at a supply voltage UB of 30 volts as a function of different ambient temperatures TU. The frequency of the PWM signal 20 is also constant here and in particular identical for reasons of comparison with the frequency of the PWM signals 20 according to the FIGS. 2a to 2c.

The degree of modulation AG of the PWM signal 20 is now according to FIG. 3a only 50 percent in distinction to FIG. 2a at an ambient temperature TU of −20° Celsius. If the ambient temperature TU is increased to 20° the degree of modulation AG is reduced according to FIGS. 3b to 30%. If the ambient temperature TU is further increased to 60°, the degree of modulation AG is reduced according to FIGS. 3c to 20 percent.

Therefore, as can be gathered by way of example from the FIGS. 2a to 3c, the degree of modulation AG can be advantageously controlled as a function of the supply voltage UB and/or of the ambient temperature TU in such a manner that upon an elevation of the supply voltage UB the degree of modulation AG is reduced and upon a reduction of the supply voltage UB it is increased.

Furthermore, upon an increase of the ambient temperature TU the degree of modulation AG is advantageously reduced and upon a reduction of the ambient temperature TU it is increased.

The degree of modulation AG is advantageously dependent in such a manner on the supply voltage UB and/or on the ambient temperature TU that the degree of modulation AG of a PWM signal of the supply voltage UB and/or of the ambient temperature TU follows a linear connection, a predetermined algorithm and/or is in a discrete connection, that is, with discrete values.

The degree of modulation AG is preferably selected from a table with predetermined values of the degree of modulation AG which are associated with predetermined values of the supply voltage UB and/or of the ambient temperature TU.

These values can advantageously be stored in the PWM module 20, in a microcontroller and/or in the control unit 50. Alternatively, instead of a table one or more discrete circuits or circuit arrangements can also be used.

FIG. 4 shows an especially advantageous embodiment of a circuit arrangement for controlling one or more switching elements, in particular according to FIG. 1, e.g., of the electrical switching elements V1 according to FIG. 1, which is advantageously constructed as a triac. However, the second switching element V1' according to FIG. 1 is not shown in FIG. 4. It can be advantageously additionally connected to the secondary winding of the ignition transformer T1 in a parallel manner by a parallel, second secondary winding of an appropriately modified ignition transformer or in another circuit arrangement such as in FIG. 4.

The circuit arrangement according to FIG. 4 is furthermore constructed as a so-called push-pull stage and improves the efficiency of the ignition transformer T1, especially by utilizing its core material during both alternating current half-waves, in particular for the present case of the activation of a first switching element V1 constructed as a triac for switching an electrical alternating current or three-phase load, that is, an alternating- or three-phase motor.

The two contacts 1 and 4 of the circuit arrangement according to FIG. 4 are connected to a supply source, e.g., the supply source 80 and correspond in this case to the first and second contacts 1 and 4 of the supply source according to FIG. 1.

Furthermore, the contact 2 of the switching arrangement according to FIG. 4 corresponds to the first output contact 2 of the PWM module 20 and is accordingly connected to the output of the PWM module 20.

Moreover, a contact 3 for forming the push-pull stage of the second arrangement according to FIG. 4 is provided as another, second output contact 3 of the PWM module and is accordingly also connected to an output of the PWM module 20 in distinction to FIG. 1 and the contact 3 in FIG. 1 is not shown for reasons of simplicity.

Furthermore, the contacts 5 and 6 correspond to the first and the second switching contacts 5 and 6 of the first switching element V1 according to FIG. 1 which can accordingly be connected, for example, to the first conductor L1 of the supply mains.

During the operation of the device of the invention according to FIG. 4, in particular also in combination with FIG. 1, the output contacts 2 and 3 of the switching arrangement according to FIG. 4 are alternatingly controlled by PWM signals which are inverted to one another, are produced by the PWM module 20 and are applied on its output contacts 2 and 3.

Accordingly, the first and the second transistors V2 and V3 shown in FIG. 4 are controlled by these PWM signals which are inverse relative to one another. Accordingly, a discharge takes place in an alternating manner via the first or the second capacitor C1 and C2, which are constructed as half-bridges for saving energy, and the primary coil of the ignition transformer T1 therefore experiences a flowthrough alternating in different directions. Consequently, the current transformed in the secondary coil of the ignition transformer T1 also flows in inverted directions in an alternating manner. The ignition current IG for the ignitions of the triac is preferably generated by a rectification G.

The PWM signal is therefore made available to the triac V1 as ignition current IG by the PWM module on the transistors V2 and V3, advantageously in a certain ratio but in particular dependent on the supply voltage UB and the ambient temperature TU. Therefore, it is secured by this variation of the PWM signal that the necessary ignition current is adjusted on the triac V1.

The invention therefore makes possible an especially efficient control of electrical and electronic switching elements which can be activated, that is, switched or actuated by an electrical signal.

For example, an especially advantageous embodiment of a switching device is possible with the invention for securely cutting in and out an electrical load, in particular an electrical motor, as well as for the energy-saving control and/or regulating of devices for monitoring or checking electrical memories such as capacitors, batteries, accumulators, etc. in which electrical or electronic switching elements are used which can be activated that is, switched or actuated by an electrical signal.

An especially advantageous usage of the invention is possible in particular in the case of so-called hybrid output stages or hybrid switches consisting of semiconductor switches such as triacs or thyristors and relays.

In the case of such hybrid switches, for example, after the cutting in the semi-conductor switch takes a current flow from a bypass relay, wherein the semi-conductor subsequently no longer conducts any current. Then, in a following, switched-on state the relay coils of the relay are constantly controlled, wherein only a lesser magnetizing current is required in the relay in this holding phase.

In order to ensure a better efficiency of energy here by the invention, a pulse width modulation can be realized for the controlling of the relay coils.

The degree of modulation of a PWM signal can then be advantageously formed dynamically in this case as a function of switching situations or switching states and as a function of an available supply voltage as well as, optionally, as a function of the ambient temperature. Possible switching states can advantageously be a first switching state in which a relay picks up, and a second switching state in which the relay is continuously controlled or picked up.

One or more switching states on a switching element can be detected by a suitable measuring device which is directly or indirectly connected to the switching element.

For an energy-saving control and/or regulation of devices for monitoring or checking electrical memories, the degree of modulation of a PWM signal can be advantageously followed by the invention.

Therefore, it is especially advantageous if a supply voltage is turned off on the supply source constructed as a storage device and the voltage on the storage device drops, to follow the degree of modulation of the PWM signal in order to be able to maintain as long as possible a required magnetization current in the relays. In this manner the available, stored energy in the storage device and the supply source can be maximally utilized and the energy storage device can be made as small as possible.

For example, if a supply voltage drops to 15 V, the degree of modulation of the PWM signal can be approximately 50 percent. If the supply voltage rises to, e.g., 30 volts, the degree of modulation of the PWM signal can be lowered to approximately 25 percent.

Therefore, it is possible by this following of a PWM signal to dimension a supply source such as a mains part, in accumulator, a battery, a capacitor, etc. to, for example, approximately one fourth of the otherwise customary value.

Another benefit is the saving of energy which furthermore allows a smaller and therefore more advantageous dimensioning of the structural components in the internal mains part of the device. Therefore, as a result of a followed degree of modulation of the PWM signal, only enough energy is always taken as is actually required for the operation of an electronic or electrical switching element such as a relay, etc. in the particular switching situation.

REFERENCE NUMERALS 1 first contact of the supply source
2 first output contact of the PWM module
3 second output contact of the PWM module
4 second contact of the supply source
5 first switching contact of the first switching element
6 second switching contact of the first switching element
7 third switching contact of the first switching element
8 second switching contact of the second switching element
10 electrical load/electromotor
20 PWM module
30 voltage measuring device
40 temperature measuring device
50 control unit
60 regulated mains part
70, 70', 70" safety switch
80 supply source/unregulated mains part
90 motor protection switch
AG degree of modulation
C1 first capacitor
C1 second capacitor
IG ignition current
L supply mains
L1, L2, L3 first, second, third conductor of the supply mains
S2 PWM signal
S1 control signal
t time
T1 ignition transformer
G rectifier
UB supply voltage
TU ambient temperature
V1 first switching element/triac
V1' second switching element/triac
V2 first transistor
V3 second transistor

The invention claimed is:

1. A method for controlling an electrical or electronic switching element that is activated by an electrical signal, which method comprises the steps:
applying a supply voltage on a PWM module,
measuring the supply voltage with a voltage measuring device and/or an ambient temperature on the switching element with a temperature measuring device,
producing a PWM signal with the PWM module for controlling the switching element,
wherein the PWM signal is modulated by a function of a switching state of the electrical or electronic switching element and by at least one function selected from a group consisting of a function of the supply voltage and a function of the ambient temperature; and
wherein the PWM signal is supplied via a transformer to the switching element.

2. The method according to claim 1, wherein the degree of modulation of the PWM signal is modulated by a function selected from a group consisting of a function of the supply voltage, a function of the ambient temperature, a linear function following a predetermined algorithm, and a constant function of discrete values.

3. The method according to claim 1, wherein the degree of modulation is selected from a table with predetermined values of the degree of modulation which are associated with a datum selected from a group consisting of predetermined values of the supply voltage and the ambient temperature.

4. The method according to claim 1, wherein the degree of modulation is controlled as a function of the supply voltage, such that upon an increase of the supply voltage the degree of modulation is lowered.

5. The method according to claim 1, wherein the degree of modulation is controlled as a function of the supply voltage, such that upon a decrease of the supply voltage the degree of modulation is increased.

6. The method according to claim 1, wherein the degree of modulation is controlled as a function of the ambient temperature, such that upon an increase of the ambient temperature the degree of modulation is lowered.

7. The method according to claim 1, wherein the degree of modulation is controlled as a function of the ambient temperature, such that upon a decrease of the ambient temperature the degree of modulation is increased.

8. A device for controlling an electrical or electronic switching element which is activated by an electrical signal, especially for carrying out a method according to claim 1, which device comprises:
a PWM module for generating a PWM signal for controlling the switching element, wherein a supply voltage is applied on the PWM module and
a voltage measuring device for measuring the supply voltage on the PWM module and/or
a temperature measuring device for measuring the ambient temperature on the switching element,
wherein the PWM signal is modulated by a function of the switching state of the switching element and by at least one function selected from a group consisting of a function of the supply voltage and a function of an ambient temperature; and
wherein the PWM signal is supplied via a transformer to the switching element.

9. The device according to claim 8, further comprising a control unit for generating a control signal which is a function of a datum selected from a group consisting of the supply voltage and the ambient temperature, wherein the control signal is supplied to the PWM module.

10. The device according to claim 8, further comprising one of an end amplifier stage for amplifying the PWM signal and an unregulated mains part for generating the supply voltage and for supplying the PWM module and the control unit.

11. The device according to claim 10, wherein the PWM module comprises the end amplifier stage.

12. The device according to claim 9, wherein the control unit is supplied by a regulated mains part.

* * * * *